(12) United States Patent
Tsvetkov et al.

(10) Patent No.: US 7,387,680 B2
(45) Date of Patent: Jun. 17, 2008

(54) METHOD AND APPARATUS FOR THE PRODUCTION OF SILICON CARBIDE CRYSTALS

(75) Inventors: Valeri F. Tsvetkov, Durham, NC (US); David P. Malta, Raleigh, NC (US)

(73) Assignee: Cree, Inc., Durham, NC (US)

( * ) Notice: Subject to any disclaimer, the term of this patent is extended or adjusted under 35 U.S.C. 154(b) by 187 days.

(21) Appl. No.: 11/128,447

(22) Filed: May 13, 2005

(65) Prior Publication Data

US 2006/0254505 A1 Nov. 16, 2006

(51) Int. Cl.
*C30B 23/04* (2006.01)
*C30B 23/06* (2006.01)

(52) U.S. Cl. .................. 117/213; 117/208; 117/217

(58) Field of Classification Search ............... 117/105, 117/109, 915, 951, 213, 214, 217, 208, 84
See application file for complete search history.

(56) References Cited

U.S. PATENT DOCUMENTS

| 4,866,005 | A | 9/1989 | Davis et al. |
| RE34,861 | E | 2/1995 | Davis et al. |
| 5,895,526 | A | 4/1999 | Kitoh et al. |
| 5,958,132 | A | 9/1999 | Takahashi et al. |
| 6,110,279 | A * | 8/2000 | Kito et al. .................. 117/105 |
| 6,336,971 | B1 * | 1/2002 | Nagato et al. ............... 117/109 |
| 6,670,282 | B2 | 12/2003 | Kuriyama et al. |
| 2002/0083890 | A1 | 7/2002 | Vodakov et al. |
| 2003/0070611 | A1 * | 4/2003 | Nakamura et al. .......... 117/109 |
| 2006/0236919 | A1 * | 10/2006 | Fusegawa et al. ............ 117/84 |
| 2007/0034145 | A1 * | 2/2007 | Maruyama et al. ......... 117/105 |

FOREIGN PATENT DOCUMENTS

| JP | 05058774 | 3/1993 |
| JP | 05-262599 | 10/1993 |
| JP | 08-143396 | 6/1996 |
| JP | 10-182297 | 7/1998 |
| JP | 2000007492 | 1/2000 |
| JP | 04-262709 | 9/2004 |

OTHER PUBLICATIONS

International Search Report for International Application No. PCT/US2006/008992, mailed Jun. 21, 2006.

* cited by examiner

*Primary Examiner*—Robert B. Davis
*Assistant Examiner*—Seyed M Malekzadeh
(74) *Attorney, Agent, or Firm*—Summa, Allan & Addition, P.A.

(57) ABSTRACT

A method and apparatus for growing silicon carbide crystals is provided. The apparatus includes a sublimation chamber with a plurality of spaced apart dividers that can direct the direction of silicon carbide crystal growth into passages between the dividers to form a plurality of silicon carbide crystal plates. The silicon carbide crystal plates can be used as seed crystals in subsequent sublimation steps in a manner that promotes the growth of silicon carbide crystals in different crystallographic directions to thereby terminate defect formation.

24 Claims, 1 Drawing Sheet

METHOD AND APPARATUS FOR THE PRODUCTION OF SILICON CARBIDE CRYSTALS

The present invention relates to a method and apparatus for the manufacture of silicon carbide crystalline material. This invention was funded under Government Contract No. N00014-02-C-0302. The Government may have certain rights in this invention.

BACKGROUND OF THE INVENTION

Silicon carbide (SiC) is a desired material for use in the manufacture of semiconductor devices. Silicon carbide has a variety of properties useful in such devices, including a wide bandgap, a high thermal coefficient, a low dielectric constant and high temperature stability. As a result, silicon carbide materials can provide excellent semiconducting properties, and electronic devices made from silicon carbide can perform at higher temperatures as compared to devices made from other materials currently used in the industry.

Traditionally, two broad categories of techniques have been used for forming crystalline silicon carbide for semiconductor applications. The first of these techniques is known as chemical vapor deposition ("CVD") in which reactant gases are introduced into a system to form silicon carbide crystals, typically in epitaxial layers, upon an appropriate substrate.

The second main technique is generally referred to as sublimation. In this technique, a silicon carbide source material (typically a powder) is used as a starting material. The silicon carbide starting material is heated in a crucible until it sublimes or vaporizes, and the vaporized material is encouraged to condense to produce the desired crystals. This can be accomplished by introducing a silicon carbide seed crystal into the crucible and heating it to a temperature less than the temperature at which silicon carbide sublimes. A pioneering patent that describes methods for forming crystalline silicon carbide for semiconductor applications using such seeded sublimation techniques is U.S. Pat. No. 4,866,005 to Davis et al., issued Sep. 12, 1989, which was reissued as U.S. Pat. No. Re. 34,861, issued Feb. 14, 1995, which patents are incorporated herein by reference as if set forth in their entirety.

Many semiconductor applications require a single crystal material with very low levels of defects in the crystal lattice and/or low levels of unwanted impurities. Even in a pure material, a defective lattice structure can prevent the material from being useful for electrical devices, and the impurities in any such crystal are preferably controlled to give certain desired electrical characteristics (such as an n or p character). For example, crystal imperfections in the SiC single crystal, including micropipe defects, screw dislocations, edge dislocations, stacking faults, and the like, can result in current leakage and reduced breakdown voltage in a SiC device.

One approach to improve SiC quality focuses on seed crystal orientation within the crucible. SiC single crystals include a {0001} plane (also referred to in the art as the c-plane) as the main plane orientation. SiC single crystals also include a {1-100} plane and a {11-20} plane (the a-planes), which are perpendicular to the {0001} plane. Conventionally, sublimation processes such as those described above use the c-plane {0001} of a silicon carbide seed crystal as the growth surface to grow bulk silicon carbide single crystals in the <0001> growth direction.

SiC single crystals grown on a c-plane, i.e., grown in a <0001> direction using a {0001} plane as a seed crystal surface, include micropipe defects, typically at a density up to $10^3$ cm$^{-2}$. Such SiC crystals can have other defects as well, such as screw dislocations, typically at a density of $10^3$ to $10^4$ cm$^{-2}$, and edge dislocations, typically at a density of $10^4$ to $10^5$ cm$^{-2}$, in a direction substantially parallel to the <0001> direction. The defects and dislocations are carried over into devices produced using the SiC single crystal, for example, devices fabricated in an epitaxial layer which is grown onto the SiC crystal. Accordingly, the defects and dislocations will also exist in the epitaxial layer at substantially the same density as in the SiC single crystal wafer and will undesirably affect device characteristics as well.

Growing bulk SiC single crystals on a seed crystal with the a-plane as the growth surface can reduce micropipe and dislocation concentrations in the {0001} plane. The resultant crystal, however, can include other undesired defects, primarily stacking faults located on {0001} planes at a density as high as $10^2$ to $10^4$ cm$^{-1}$ in a direction substantially parallel to the direction of the crystal growth. Such defects are also carried over into downstream products incorporating the SiC crystal as a component. SiC power devices manufactured from such a SiC wafer can in turn have a relatively high on resistance and a relatively large current leakage in the reverse direction, thereby undesirably affecting performance of the device.

U.S. Patent Application Publication 2003/007611 is directed to a process of manufacturing SiC single crystals using a series of seed crystals having different growth planes. In the '611 application, a first SiC crystal grows in a <1-100> or <11-20> direction (or in an "a-plane" direction) on a first seed crystal having a first growth surface, typically a plane having an inclination of 20 degrees or smaller from a {1-100} or {11-20} plane. The resultant silicon carbide crystal is processed (wafered) to make a second seed crystal having a second growth surface with an inclination of 45 to 90 degrees from a {0001} plane of the first grown crystal. Subsequently, another silicon carbide crystal is grown on the second seed crystal, from which is formed a final seed crystal having a growth surface with a plane having an inclination of 20 degrees or less from a {0001} plane of the second grown crystal.

The '611 application reports that the process reduces edge dislocations and stacking faults. The process, however, suffers various drawbacks. The SiC crystals produced in each sequential step must be processed, i.e., the silicon carbide boule must be wafered, or sliced, polished and ground (to remove polycrystalline growth), to form a seed crystal suitable for use in the next step of the process. Each such step can be time consuming and labor intensive. In addition, the requisite slicing of each subsequently grown SiC crystal boule can result in substantial loss of material, resulting in an overall low yield.

Therefore, a need exists for methods of producing SiC crystalline material useful as silicon carbide seed crystals having reduced defects, in a cost effective and time efficient manner, to facilitate large scale production of semiconductor devices including such materials.

BRIEF SUMMARY OF THE INVENTION

The present invention provides a method and apparatus for the production of silicon carbide crystalline materials having reduced defects. To reduce the concentration of defects, silicon carbide crystals are grown in alternating crystallographic growth directions. Alternating the growth of silicon carbide in this manner can terminate defects specific to a particular crystal orientation. The silicon carbide crystals produced in accordance with the present invention are useful as silicon carbide seed crystals, which, because of their reduced defect concentrations, can facilitate the production of bulk silicon carbide single crystals also having reduced defect concentrations.

The invention also allows the production of a plurality of silicon carbide materials in a single sublimation step. As a result, silicon carbide crystals can be produced in a time and cost efficient manner. Further, the growth of the silicon carbide crystals is directed in a manner that facilitates the subsequent use of the crystals without the time consuming and labor intensive steps often required by prior techniques. In addition, the invention can provide higher yields of silicon carbide materials.

The method of the invention includes the step of introducing a silicon carbide seed crystal into a silicon carbide growth chamber. The seed crystal has a first silicon carbide growth surface with a first growth plane. The seed crystal accordingly supports the growth of silicon carbide crystal from a silicon carbide source material in a first crystallographic direction corresponding to the first growth plane.

The method further includes the step of introducing a plurality of silicon carbide crystal growth dividers into the silicon carbide growth chamber. The dividers have opposing surfaces oriented substantially perpendicular to the first growth surface. In addition, the dividers are spaced apart from one another to form a plurality of passages. The passages between the dividers are of a size sufficient to accommodate the growth of silicon carbide crystals between the dividers.

In the method, silicon carbide source material is supplied in the chamber and silicon carbide crystalline material is grown on the first growth surface in the first crystallographic direction. The dividers direct the direction of growth of the crystal so that the crystal grows from the growth surface and into the passages between the dividers to form a plurality of silicon carbide crystals having opposing surfaces that are also substantially perpendicular to the first growth surface. The resultant silicon carbide crystals can mirror the shape of the passages into which their growth is directed, which passages advantageously impart a plate like structure to the silicon carbide crystals. As a result, the opposing surfaces of the resultant silicon carbide crystals provide a second growth surface with a second growth plane that is different from the first growth plane. The plurality of silicon carbide crystals thus produced are suitable for use as seed crystals in subsequent sublimation steps, in which the second growth plane of the recovered crystals supports the growth of additional silicon carbide crystals in a second crystallographic direction.

In subsequent steps, at least one of the silicon carbide crystals with the second growth plane is recovered and introduced into a silicon carbide growth chamber to expose the second growth plane as a second silicon carbide growth surface. Silicon carbide source material is supplied to the chamber and silicon carbide crystalline material is grown on the second growth surface in the second crystallographic direction.

In this way, silicon carbide crystals can be grown in alternating crystallographic growth directions, which can cancel or terminate defect formation specific to a particular crystal orientation. In addition, because the dividers can promote the formation of silicon carbide crystal plate like structures, the crystals can be used as seed crystals in subsequent sublimation processes without the time consuming, labor intensive wafering steps (i.e., slicing a crystal boule, grinding to remove polycrystalline growth, etc.) required by prior techniques. Eliminating such wafering steps can also reduce waste and increase yields.

The present invention also includes an apparatus for the production of silicon carbide crystalline material. The apparatus includes a silicon carbide growth chamber with at least one silicon carbide seed crystal. The seed crystal has a first silicon carbide growth surface with a first silicon carbide crystal growth plane for supporting the growth of silicon carbide crystalline material from a silicon carbide source material in a first crystallographic direction corresponding to the first growth plane. The apparatus of the invention further includes a plurality of silicon carbide crystal growth dividers in the growth chamber. The dividers have opposing surfaces oriented substantially perpendicular to the first growth surface and are spaced apart from one another to form a plurality of passages therebetween of a size sufficient to accommodate the growth of silicon carbide crystals.

BRIEF DESCRIPTION OF THE DRAWING

Figure 1:
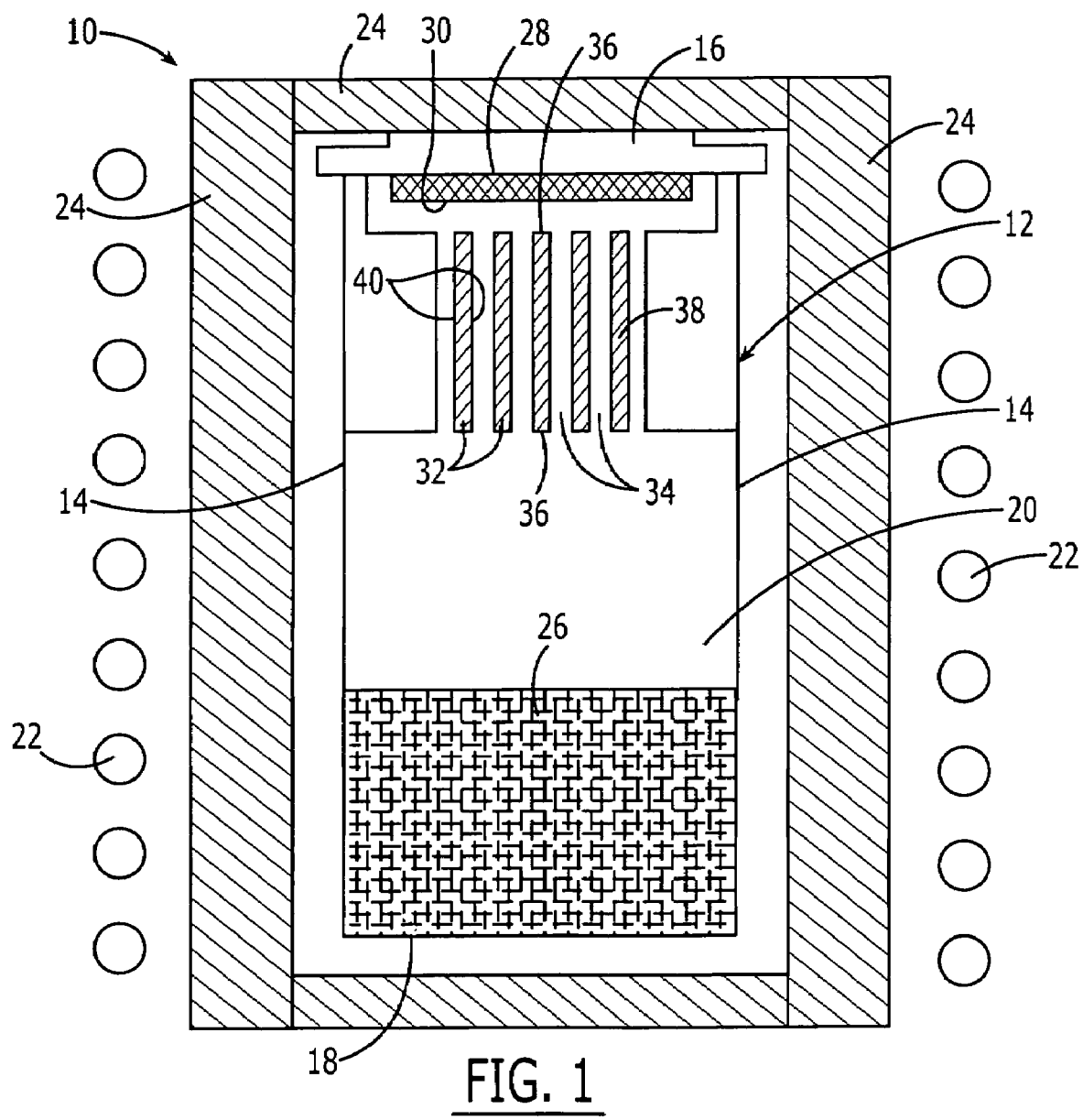

Having thus described the invention in general terms, reference will now be made to the accompanying drawing, which is not necessarily drawn to scale, and in which FIG. 1 is a schematic cross sectional view of an exemplary seeded sublimation system in accordance with one embodiment of the present invention for producing silicon carbide crystalline material.

DETAILED DESCRIPTION OF THE INVENTION

The present invention now will be described more fully hereinafter with reference to the accompanying drawing, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

The general aspects of various techniques for the growth of silicon carbide, including chemical vapor deposition and seeded sublimation techniques, have been generally well established for a number of years. Furthermore, those familiar with the growth of crystals, particularly in difficult material systems such as silicon carbide, will recognize that the details of a given technique can and will vary, usually purposefully, depending upon the relevant circumstances. Accordingly, descriptions given herein are most appropriately given in a general and schematic sense with the recognition that those persons of skill in this art will be able to carry out the invention based on the disclosures herein without undue experimentation.

The present invention will be described in terms of a seeded sublimation apparatus and method. The present invention, however, is not so limited and can have applicability to any of the types of apparatus and techniques utilized in the art for the growth of silicon carbide crystalline material upon a silicon carbide crystal seed substrate.

FIG. 1 is a cross sectional schematic diagram of a sublimation system for seeded sublimation growth of the type contemplated as useful in the present invention. The sublimation system is broadly designated at 10. The sublimation system 10 includes a graphite crucible 12 having side walls 14 and opposing ends, for example, a lid 16 and a bottom 18. The inner surfaces of side walls 14, lid 16, and bottom 18 define a silicon carbide crystal growth chamber 20, which, as illustrated, can be a sublimation chamber, within crucible 12, suitable for the growth of silicon carbide crystalline material by sublimation, also referred to as physical vapor transport (PVT), techniques, as known in the art.

Crucible 12 advantageously has a cylindrical shape but can have any of a variety of suitable shapes. For example, crucible 12 can include four separate walls 14 positioned to form a generally solid rectangle or cube shape. Accordingly, as used herein, reference to a wall or walls 14 of the crucible 12 includes any wall configuration suitable for creating a sublimation chamber 20, including without limitation a single continuous wall forming a substantially cylindrical shaped crucible, four separate walls forming a generally cube shaped crucible, and the like.

Sublimation system 10 can further include a plurality of induction coils 22 that heat the crucible 12 when current is applied through the coils 22. Alternatively, some systems incorporate resistance heating. It will be understood by those familiar with these crystal growth techniques that the system can be further enclosed in some circumstances, e.g., in a water-cooled quartz vessel. Additionally, at least one gas inlet and outlet (not shown) in communication with the crucible 12 are included in the seeded sublimation system 10. Such further enclosures are, however, less relevant to the invention and are omitted herein to help clarify the drawing and description. Additionally, those persons skilled in this art recognize that silicon carbide sublimation systems of the type described herein are available both commercially and as constructed in a custom fashion as may be necessary or appropriate. They accordingly can be selected or designed by those of ordinary skill in this art without undue experimentation.

The crucible 12 is typically surrounded by insulation 24, several portions of which are illustrated in FIG. 1. Although FIG. 1 illustrates the insulation 24 as being generally consistent in size and placement, it will be understood and is recognized by those of skill in the art that the placement and amount of the insulation 24 can be used to provide desired thermal gradients (both axially and radially) along the crucible 12. Again, for purposes of simplification, these possible permutations are not illustrated herein.

The crucible 12 includes one or more portions for containing a silicon carbide source material 26. The silicon carbide source material 26 is typically, although not exclusively, in powder form. FIG. 1 illustrates the silicon carbide source material 26 as being contained in a lower portion of the crucible 12, and this is one typical arrangement. As another familiar variation, some systems distribute the source material in a vertical, cylindrical arrangement in which the source material surrounds a larger portion of the interior of the crucible 12 than does the arrangement illustrated in FIG. 1. The invention described herein can be appropriately carried out using both types of equipment.

A silicon carbide seed crystal having a silicon carbide crystal growth surface 30 is designated at 28. As illustrated in FIG. 1, the silicon carbide seed crystal 28 is typically placed in upper portions of the crucible 12. A growing silicon carbide crystal is deposited on the growth surface 30 of the seed crystal 28 during the seeded sublimation growth, as discussed in more detail below.

The seed crystal 28 can have any of the silicon carbide crystal growth planes exposed to the sublimation chamber 20 for promoting and supporting the growth of silicon carbide crystalline material in a crystallographic direction corresponding to the selected growth plane. As discussed above, SiC single crystals include a $\{0001\}$ growth plane (the c-plane) as the main plane orientation, as well as $\{1\text{-}100\}$ and $\{11\text{-}20\}$ growth planes (the a-planes), which are perpendicular to the $\{0001\}$ growth plane.

As will be appreciated by the skilled artisan, variations from a referenced growth plane are included within the scope of the present invention. As a non-limiting example, a $\{0001\}$ growth plane can include growth planes that are inclined in an amount ranging from about −45° to about +45° relative to the referenced $\{0001\}$ plane. Similarly, a $\{1\text{-}100\}$ growth plane and a $\{11\text{-}20\}$ growth plane can include growth planes that are inclined in an amount ranging from about −45° to about +45° relative to the referenced $\{1\text{-}100\}$ or $\{11\text{-}20\}$ plane. Accordingly, as used herein, reference to a growth plane includes about +/−45° incline variations thereof. The terms "about" or "approximate" a given growth plane (for example, about or approximate a $\{0001\}$ growth plane, about or approximate a $\{1\text{-}100\}$ growth plane, or about or approximate a $\{11\text{-}20\}$ growth plane) are also used herein to refer to variations of a given growth plane, such as incline variations relative to the referenced growth plane ranging from about −45° to about +45°. Thus one skilled in the art will understand that reference to growth planes of silicon carbide includes variations from that plane and that the present invention is not limited to a silicon carbide crystal with the exact referenced growth plane.

Accordingly, in the present invention, the seed crystal 28 can have about a $\{0001\}$ growth plane exposed as the growth surface 30 to grow silicon carbide crystals substantially in the <0001> growth direction. Alternatively, the seed crystal 28 can have about a $\{1\text{-}100\}$ growth plane or about a $\{11\text{-}20\}$ growth plane exposed as the growth surface 30 to grow silicon carbide crystals substantially in the <1-100> and <11-20> directions, respectively.

In alternative embodiments of the invention, the sublimation chamber 20 can include two or more seed crystals 28, at least two of which have different growth planes exposed to the interior of the sublimation chamber as growth surfaces 30 to promote and support the growth of silicon carbide crystals in different crystallographic directions. As a non-limiting example, the sublimation chamber 20 can have at least two seed crystals 28 placed side by side so that the growth surface 30 of each seed crystal 28 is exposed to the interior of the sublimation chamber to promote and support the growth of silicon carbide crystals on each growth surface. In this example, at least one of the seed crystals 28 can have about a $\{0001\}$ growth plane as the growth surface 30 exposed to the sublimation chamber for promoting and supporting the growth of silicon carbide crystals substantially in the <0001> direction. The other of the seed crystals 28 can have about a $\{1\text{-}100\}$ or $\{11\text{-}20\}$ growth plane as the growth surface 30 exposed to the interior of the sublimation chamber for promoting and supporting the growth of silicon carbide crystals substantially in the <1-100> or <11-20> direction, respectively. This aspect of the invention is not limited to the use of two different growth surfaces, and accordingly the sublimation chamber can also include, for example, three or more seed crystals 28, at least two of which have different growth planes exposed to the interior of the crucible.

A silicon carbide seed crystal holder typically holds the seed crystal 28 in place with the seed holder being attached to the crucible 12. In the embodiment illustrated in FIG. 1, the seed holder is an integral part of the lid 16, although the skilled artisan will appreciate that the lid and seed holder can be separate components. The seed holder is attached to the crucible in an appropriate fashion, including various resting or threaded arrangements. In the orientation illustrated in FIG. 1, the upper portions of the seed holder would typically include threads as would the uppermost portions of the crucible 12, so that the seed holder could be threaded into the top of the crucible 12 to hold the seed crystal 28 in the desired position. The skilled artisan will appreciate, however, that the seed holder can alternatively be positioned within a lower region of the crucible 12 proximate the crucible bottom 18, as a separate or integral component of the crucible 12. The seed holder is preferably a graphite seed holder.

Dopant atoms can be included in the sublimation system 10. Introducing dopant gases to the seeded sublimation system 10 incorporates dopant atoms in a growing crystal. Dopants are selected for their acceptor or donor capabilities. Donor dopants are those with n-type conductivity and acceptor dopants are those with p-type conductivity. Preferred dopant atoms include n-type and p-type dopant atoms. Exemplary n-type dopants include N, P, As, Sb, Bi, and mixtures thereof. Exemplary p-type dopants include B, Al, Ga, In, Tl, and mixtures thereof.

The sublimation system 10 of the invention further includes a plurality of dividers or separators, designated at 32 in FIG. 1, that direct or guide the growth of silicon carbide crystalline material growing from the growth surface (s) 30. In particular, as discussed in more detail below, the dividers 32 direct or guide silicon carbide crystal growth into spaces or passages 34 between the dividers 32. In this way, the apparatus of the invention facilitates the growth of a plurality of silicon carbide crystal structures, referred to herein as silicon carbide crystal plates, as vaporized silicon carbide source material is deposited on the growth surface(s) 30 of the seed crystal 28 and forms a growing silicon carbide crystal. The silicon carbide plates can be readily recovered from the crucible and used in any of a variety of downstream processes, including but not limited to the use of the recovered crystals as seed crystals in subsequent sublimation processes, generally without extensive time consuming and expensive wafering steps. The present invention not limited to the use of the recovered crystals as seed crystals in sublimation processes. The recovered crystals can also be used, for example, as substrates in the manufacture of electronic devices, including substrates supporting the growth, including epitaxial growth, of one or more layers of silicon carbide or other materials thereon. Also as discussed in more detail below, the dividers 32 can also function as buffers to cushion stress on the growing silicon carbide crystals, which in turn can further reduce defect formation in the crystals, such as stacking faults.

The dividers 32 can have any of a variety of shapes, but generally can be described as body members with opposing upper and lower edges 36, opposing side edges 38, and opposing major surfaces 40. The dividers 32 are positioned within the crucible 12 so that the upper edges 36 are proximate to, but advantageously do not contact, the growth surface(s) 30 of seed crystal(s) 28. Stated differently, the upper edges 36 of the dividers 32 are typically spaced apart from the growth surface(s) 30 of the seed crystal(s) 28. The dividers 32 are also positioned within the crucible chamber 12 so that the opposing surfaces 40 are oriented substantially perpendicular to the growth surface(s) 30 of the seed crystal (s) 28.

In addition, the dividers 32 are spaced apart from one another to form a plurality of spaces or passages 34, as noted above, between adjacent dividers. In this way, the dividers 32 form a plurality of passages 34 that allow the passage of volatile species evaporating or subliming from the silicon carbide source material 26 to the growth surface(s) 30 of the seed crystal(s) 28.

The dividers 32 can be secured within the crucible chamber 12 in any of a variety of ways to minimize movement or displacement thereof during seeded sublimation processes. As a non-limiting example, the opposing side edges 38 can be inserted into slots (not shown) or other integral or separate holding mechanisms adapted for receiving and securing into place a body member such as the dividers 32 provided on opposing walls 14 of the crucible chamber. Other mechanisms as known in the art for receiving and securing body members such as the dividers 32 illustrated in FIG. 1 will be understood and recognized by those of skill in the art, and for purposes of simplification, these possible permutations are not illustrated herein.

The dividers 32 can have a variety of configurations, so long as the dividers include opposing major faces 40 oriented substantially perpendicular to the growth surface(s) 30 of the seed crystal(s) 28. As a non-limiting example, the dividers 32 illustrated in FIG. 1 have a generally sheet-like appearance with substantially rectangular shaped opposing surfaces 40 that are also substantially flat or planar and aligned parallel to one another. The present invention is not limited to the illustrated divider shape, however, and as another non-limiting example, one or more of the dividers 32 can have a profiled shape in which one or both of the opposing major surfaces 40 are not substantially planar (i.e., one or both of opposing surfaces 40 can have a profiled surface, such as a zig zig surface configuration with alternating "peaks" and "valleys", a curved or arced surface configuration, and the like).

As the vaporized silicon carbide source material condenses first on the growth surface(s) 30 of the seed crystal(s) 28 and thereafter on the growing silicon carbide crystal, the dividers 32 direct the growth of the silicon carbide crystal from the silicon carbide growth surface(s) and into the passages 34 separating the dividers 32. The sublimation process continues for a time sufficient to permit the growth of a plurality of silicon carbide crystals within the passages 34 in a direction along and parallel to the opposing surfaces 40. The length of the resultant silicon carbide crystals can vary and generally does not surpass the length of a divider 32 adjacent a particular crystal. Stated differently, the silicon carbide crystals advantageously do not grow substantially beyond the lower edges 36 of the dividers 32 so as to minimize possible cross contamination of crystals in adjoining spaces 34.

The sublimation method in this way can provide a plurality of silicon carbide crystal plates formed in the passages 34 between the dividers 32. Each of the silicon carbide crystal plates can be characterized as having opposing surfaces that can mirror the surface configuration of an adjacent surface 40 of a particular divider. In this manner, for example, the use of the dividers 32 as illustrated having substantially flat opposing surfaces 40 can result in silicon carbide crystal plates also with substantially flat opposing surfaces. Alternatively, the use of dividers in which one or both of the opposing surfaces have a profiled configuration can result in the growth of silicon carbide crystal plates with a surface configuration that mirrors the shaped surface configuration of an adjacent surface 40.

Generally the dividers 32 are formed of a material having a density that is low enough, i.e., the material is soft enough, to provide a buffer between the silicon carbide crystals to reduce stress on the growing silicon carbide. Yet, the material should also have a density sufficiently high to prevent substantial penetration of the dividers by vaporized silicon carbide source material, which can result in undesired reactions with the material and composite formation. The dividers 32 are typically formed of graphite, which is commercially available in different densities. The use of a graphite material can provide additional benefits, such as provide an additional carbon vapor source in a region adjacent the growing silicon carbide crystals. In contrast, the vapor phase adjacent a growing silicon carbide crystal in conventional sublimation processes is typically carbon deficient.

As a non-limiting example, graphite materials useful in the invention can have a density ranging from about 1.70 grams per cubic centimeter (g-cm$^{-3}$) to about 2.00 grams per cubic centimeter (g-cm$^{-3}$) to minimize or prevent substantial penetration of the dividers by the vaporized source material, but also provide the desire buffering or cushioning effect. Graphite materials with densities falling within this range are commercially available and include, without limitation, graphite materials available from Carbone of America, SGL, and POCO, among others.

The material of dividers 32 is also selected to have a coefficient of thermal expansion (CTE) which is substantially the same as or less than the coefficient of thermal expansion of a silicon carbide crystal to be grown adjacent to the divider. The CTE of the material can vary, depending upon the particular characteristics of a given silicon carbide crystal to be grown in the crucible of the invention, so long as the CTE of the divider material is substantially the same as or less than the CTE of the resultant crystal. Generally, the CTE of the divider material is less than or about $4 \times 10^{6 \circ}$ C.$^{-1}$, and advantageously less than or about $3.8 \times 10^{6 \circ}$ C.$^{-1}$. This can provide the advantage of reducing or substantially eliminating stress in the silicon carbide crystal produced in accordance with invention as the crystal is cooled following the growth process to thereby reduce defect formation.

One or more of the dividers 32 can be formed of a single layer of a selected material. Alternatively, one or more of the dividers 32 can be formed of multiple layers of selected materials, which materials can be same or different. For example, one or more of the dividers 32 can be formed of a single layer of a selected graphite material. As another example, one or more of the dividers 32 can be formed of two or more layers of selected materials. In this aspect of the invention, each of the respective layers can be formed of the same material, or alternatively, at least two or more of the respective layers can be formed of different materials, such as different graphite materials with different densities, CTEs, and the like.

This aspect of the invention can be particularly advantageous in embodiments of the invention employing two or more seed crystals 28 with different growth planes as the growth surfaces 30. As the skilled artisan will appreciate, silicon carbide crystals have different properties, such as different CTEs, depending at least in part on the crystallographic growth direction of the crystal. Accordingly, one or more dividers can include at least one opposing surface 40 formed of a first material having properties (such as a CTE) substantially matching the corresponding properties of a crystal grown adjacent that surface, originating from a first seed crystal having a growth surface with a first plane of growth. In this same example, the other of the opposing surfaces 40 of a select divider 32 can be formed of a different material having properties substantially matching the corresponding properties of another crystal grown adjacent that surface, the second crystal originating from a different seed with a growth surface having a different plane of growth.

As an additional component, one or more of the dividers can also includes a coating along one or both of opposing surfaces 40. The coating advantageously also provides a substantial barrier to the penetration of silicon carbide source material vapor. The coating can also advantageously have a coefficient of thermal expansion (CTE) substantially the same as or less than the coefficient of thermal expansion of a silicon carbide crystal single crystal to be grown along a given surface 40 of a divider 32. Exemplary coating materials useful in this aspect of the invention include without limitation high melting point metals and carbides thereof, such as but not limited to tantalum and tantalum carbide, niobium and niobium carbide, titanium and titanium carbide, zirconium and zirconium carbide, hafnium and hafnium carbide, and the like, as well as mixtures thereof. Other exemplary coating materials include pyrolytic graphite materials as also known in the art. Such materials are commercially available.

When present, the coating can be a single layer. The present invention is not limited to a single coating, and two or more coatings, which can be of the same or different materials, can be present on one or both of opposing surfaces 40 of one or more dividers 32. In addition, the coating can be present along the entire surface of the dividers 32. Alternatively, the coating can be present along a select portion of the opposing surface of a divider 32, for example, along a portion of one or both of opposing surfaces 40 of one or more dividers 32 proximate the crystal growth surface(s) 30.

Other particulars of the dividers 32, such as the number of plates present in the apparatus, the dimensions of the dividers (length, width, height) and placement within the apparatus (distance from the growth surface(s) 30 of seed crystal (s) 28 and distance from one another), can differ, depending on various desired properties of the resultant silicon carbide crystal plates, such as the desired thickness of the plates. In view of the teachings herein, those persons skilled in this art will appreciate and recognize variations of divider size, location, and the like, and they accordingly can be selected or designed by those of ordinary skill in this art without undue experimentation. Again, for purposes of simplification, these possible permutations are not illustrated herein.

The present invention also provides a method for producing silicon carbide crystalline material that is useful as silicon carbide seed crystals in subsequent sublimation processes. Generally, the method of the invention is a sublimation or physical vapor transport process for the production of silicon carbide crystals. The present invention, however, is not limited to sublimation methods and can be applicable to other techniques known in the art for the production of silicon carbide crystalline material which is based upon the use of a seed crystal for the formation and growth of appropriate silicon carbide crystals. For ease of discussion, however, the present invention will be described in general terms with respect to its application in sublimation techniques.

The general scheme for sublimation growth is set forth briefly in the Background portion of the specification, as well as in other sources well-known to those of ordinary skill in this art. Typically, an electric current, having a frequency to which the crucible 12 responds, is passed through the induction coils 22 to heat the graphite crucible 12. The amount and placement of the insulation 24 are selected to create a thermal gradient between the source material 26 and the growing crystal when the crucible 12 heats the source material 26 to sublimation temperatures.

Typical sublimation temperatures range from about 1800-2400° C., with a temperature of about 2000° C. and higher being particularly useful for many applications. At these temperatures, volatile species evaporate from the silicon carbide source material 26. The thermal gradient is established to maintain the temperature of the seed 28 and thereafter a growing crystal near, but below, the temperature of the silicon carbide source to thereby thermodynamically encourage the vaporized species that are generated when silicon carbide sublimes to condense first upon the seed crystal 28 and thereafter upon the growing crystal; e.g., U.S. Pat. No. 4,866,005.

After reaching the desired crystal size, growth is terminated by reducing the temperature of the system to below about 1900° C. and raising the pressure to above about 400 torr. It may be further desirable to anneal the crystal after completion of the sublimation growth process. The crystal may be annealed at temperatures above about 2500° C. for a period greater than about 30 minutes.

For purposes of clarity, the singular term, "thermal gradient," will be used herein, but it will be understood by those of skill in this art that several gradients can desirably co-exist in the crucible 12 and can be subcategorized as axial and radial gradients, or as a plurality of isotherms. If the temperature gradients and other conditions (pressure, carrier gases, etc.) are properly maintained, the overall thermodynamics will encourage the vaporized species to condense first on the seed 28 and then on the growing crystal in the same polytype as the seed 28.

In the present invention, a seed crystal of silicon carbide having a desired polytype is introduced into a sublimation chamber, such as that described above with reference to FIG. 1. A silicon carbide source material is also introduced into the sublimation chamber. The silicon carbide source is typically a silicon carbide powder, but other source materials as known in the art may also be used in accordance with invention. In addition, dopants as known in the art may also be introduced into the crucible in accordance with known techniques.

The silicon carbide seed crystal has at least one surface suitable for promoting the growth of silicon carbide crystals. The seed crystal is positioned within the sublimation chamber so that the growth surface is exposed to volatilized silicon carbide source materials to allow condensation of the same on the growth surface in a manner sufficient to promote growth of the desired bulk crystal. In particular, the seed crystal has a silicon carbide growth surface corresponding to a particular silicon carbide growth plane, i.e., about a {0001}, {1-100} or {11-20} growth plane, exposed to the interior of the sublimation chamber to support the growth of silicon carbide crystals in the corresponding crystallographic growth direction (i.e., substantially in a <0001>, <1-100>, or <11-20> direction, respectively).

As discussed above, two or more seed crystals can be introduced into the sublimation chamber. In this aspect of the invention, at least two of the seed crystals can have different growth planes exposed to the interior of the sublimation chamber as growth surfaces to promote and support the growth of silicon carbide crystals in different crystallographic directions.

After the seed crystal and silicon carbide source material are introduced into the sublimation chamber, the temperature of the silicon carbide source material is raised to a temperature sufficient for silicon carbide to sublime from the source material. As the temperature of the source material is raised, the temperature of the growth surface of the seed crystal is likewise raised, typically to a temperature approaching the temperature of the source material but lower than the temperature at which silicon carbide will sublime so as to encourage condensation of the sublimed species from the source material onto the seed crystal. As a non-limiting example, the source material can be heated to a temperature of about 2000° C., with the seed crystal being heated to a temperature slightly lower. Temperatures lower or higher than these temperatures can also be useful so long as the reaction conditions are selected to promote the sublimation and condensation of silicon carbide to form the desired silicon carbide crystal. Other process conditions within the crucible can be controlled in accordance with known procedures in the art, including for example, vapor pressures, thermal gradients between the growth surface of the seed crystal and the source material, and the like.

The apparatus further includes a plurality of dividers positioned so that opposing surfaces thereof are oriented substantially perpendicular to the growth surface(s) of the seed crystal(s). The dividers are spaced apart from one another to form openings having a size sufficient to allow the continued growth of silicon carbide crystal between the dividers. The dividers in effect direct or guide the growth of the silicon carbide crystal into the openings in a direction along and substantially parallel to the opposing surfaces of the dividers. In this manner, the method of the invention forms a plurality of silicon carbide plates having a thickness substantially the same as or less than the distance between surfaces of adjacent dividers that form the passages into which the silicon carbide crystal growth is directed.

The resultant silicon carbide plates have opposing major surfaces that are substantially parallel to the surfaces of adjacent dividers forming the space in which the silicon carbide plates are grown. The opposing surfaces of the resultant silicon carbide plates will accordingly have a growth plane that is different from the growth plane of the seed crystal supporting its growth. Stated differently, the major opposing faces of the resultant silicon carbide crystal plates will have a growth surface with a growth plane that is substantially perpendicular to the growth plane of the seed crystal. The silicon carbide crystal plates can accordingly be recovered from the sublimation chamber, polished as necessary, and used as seed crystals for a subsequent sublimation processes to promote and support silicon carbide crystal growth in a different crystallographic orientation. The method optionally includes repeating these steps to continue to grow silicon carbide crystals in alternating crystallographic directions.

As a non-limiting example, the present invention can include a first sublimation step using a first seed crystal with about a {0001} growth plane to grow a plurality of silicon carbide crystal plates substantially in the <0001> direction. The resultant silicon carbide crystal plates will have opposing major surfaces substantially perpendicular to the {0001} growth surface of the first seed crystal. The opposing surfaces of the resultant silicon carbide crystal plates will have a growth plane of about {1-100} or {11-20}. The silicon carbide crystal plates can be recovered, and, in a second sublimation step, used as seed crystals with growth surfaces corresponding to the {1-100} or {11-20} growth planes to promote and support silicon carbide crystal growth in a crystallographic direction corresponding to the growth plane of the major opposing surfaces of the plates, i.e., substantially in the <1-100> or <11-20> direction. The use of dividers as described herein in the second sublimation step will produce a second set of silicon carbide plates with major opposing surfaces substantially perpendicular to the growth surface of the seed crystal. The major opposing surfaces of the resultant second set of silicon carbide plates will have a growth plane of about {0001}. The second set of silicon carbide crystal plates can be recovered and also used as seed crystals in a third sublimation step to promote and support silicon carbide crystal growth substantially in the <0001> direction. The steps can optionally continue to provide silicon carbide crystals having the desired degree of defect reduction, size, and the like.

In this manner, the method of the invention provides a technique for the production of a plurality of silicon carbide crystal plates in a single step, which are suitable for use as seed crystals in subsequent sublimation steps. The silicon carbide plates can be used as seed crystals without requiring wafering steps, which can be time and labor intensive. Wafering steps can also result in substantial loss of material, and accordingly, because such steps are eliminated, the present invention can also improve yields as well.

In addition, the method of the invention provides a technique for minimizing defect formation in a seed crystal. This, in turn, can reduce defect formation in silicon carbide crystals produced using the improved seed crystal. The silicon carbide crystals produced in accordance with the present invention can have reduced defects because alternating the growth of the silicon carbide crystal in different crystallographic directions can terminate defects perpendicular to the growth direction. For example, growing a first silicon carbide crystal in the <0001> direction will result in a crystal with defects associated with growth in this direction, namely, micropipes, edge dislocations, and the like. Growing a second silicon carbide crystal on a growth plane perpendicular to the <0001> direction of the resultant crystal, i.e., on its {1-100} or {11-20} growth plane, can, however, terminate further propagation of these defects so as the significantly reduce the concentration of such defects in a silicon carbide crystal grown thereon. Growing the second crystal in the <1-100> or <11-20> direction can result in defects associated with this growth plane, such as stacking faults. Accordingly, growing a third silicon carbide crystal on a growth plane perpendicular to the <1-100> or <11-20> direction of the second crystal, i.e., on the {0001} growth plane of the second crystal, can terminate these defects as well so that the third silicon carbide crystal will have significantly reduced numbers of stacking faults, as well as reduced concentrations of micropipes and dislocations.

In the drawing and specification there has been set forth a preferred embodiment of the invention, and although specific terms have been employed, they are used in a generic and descriptive sense only and not for purposes of limitation, the scope of the invention being defined in the claims.

That which is claimed is:

1. An apparatus for the production of silicon carbide crystalline material, comprising:
    a silicon carbide growth chamber;
    at least one silicon carbide seed crystal having a first silicon carbide growth surface with a first silicon carbide crystal growth plane in said chamber for supporting the growth of silicon carbide crystalline material from a silicon carbide source material in a first crystallographic direction corresponding to said first growth plane; and
    a plurality of silicon carbide crystal growth dividers in said silicon carbide growth chamber, said dividers having opposing major surfaces oriented substantially perpendicular to said first growth surface, wherein said dividers are spaced apart from one another to form a plurality of passages between said dividers of a size sufficient to accommodate the growth of silicon carbide crystals therebetween.

2. The apparatus of claim 1, wherein said dividers comprise a material having a density sufficient to provide a buffer to reduce stress on silicon carbide crystals grown in said passages.

3. The apparatus of claim 2, wherein said material has a density sufficient to prevent substantial penetration thereof by a silicon carbide source material.

4. The apparatus of claim 3, wherein said material is carbon having a density ranging from about 1.70 grams per cubic centimeter (g-cm$^3$) to about 2.00 grams per cubic centimeter (g-cm$^3$).

5. The apparatus of claim 1, wherein said dividers comprise a material having a coefficient of thermal expansion (CTE) selected to minimize defect formation of a silicon carbide crystal adjacent thereto.

6. The apparatus of claim 5, wherein said dividers comprise a material having a CTE that is substantially the same as the CTE of a silicon carbide crystal grown adjacent thereto.

7. The apparatus of claim 1, further comprising at least a second silicon carbide seed crystal having a second silicon carbide crystal growth surface with a second silicon carbide growth plane that is different from said first growth plane for supporting the growth of silicon carbide crystalline material from a silicon carbide source material in a second crystallographic direction that is different from said first crystallographic direction.

8. The apparatus of claim 7, further comprising three or more silicon carbide seed crystals, at least two of which comprise silicon carbide crystal growth planes that are different from one another for supporting the growth of silicon carbide crystalline material in at least two different crystallographic directions.

9. The apparatus of claim 1, wherein said first silicon carbide crystal growth plane comprises a growth plane selected from the group consisting of about a {0001} growth plane, about a {1-100} growth plane, and about a {11-20} growth plane.

10. The apparatus of claim 7, wherein each of said first and second growth planes comprises a growth plane selected from the group consisting of about a {0001} growth plane, about a {1-100} growth plane, and about a {11-20} growth plane.

11. The apparatus of claim 1, wherein said dividers have substantially planar opposing surfaces.

12. The apparatus of claim 1, wherein said dividers have substantially non-planar opposing surfaces.

13. The apparatus of claim 1, wherein at least one of said dividers comprises a single layer.

14. The apparatus of claim 1, wherein at least one of said dividers comprises a first layer and a second layer, wherein said first and second layers form opposing surfaces of said divider.

15. The apparatus of claim 14, wherein said first and second layers are formed of the same material so that said divider has the same properties on opposing surfaces thereof.

16. The apparatus of claim 14, wherein said first and second layers are formed of different materials so that said divider has different properties on opposing surfaces thereof.

17. The apparatus of claim 1, wherein at least one of said dividers comprises a coating on at least one of said divider opposing surfaces.

18. The apparatus of claim 17, wherein at least one of said dividers comprises a coating on both of said divider opposing surfaces.

19. The apparatus of claim 17, wherein said coating material comprises a metal, a metal carbide, or a mixture thereof.

20. The apparatus of claim 19, wherein the coating material is selected from the group consisting of tantalum, tantalum carbide, niobium, niobium carbide, titanium, titanium carbide, zirconium, zirconium carbide, hafnium, hafnium carbide and mixtures thereof.

21. The apparatus of claim 17, wherein said coating material comprises a pyrolytic graphite coating.

22. An apparatus for the production of silicon carbide crystalline material, comprising:
 a silicon carbide growth chamber;
 a first silicon carbide seed crystal having a first silicon carbide growth surface with a first silicon carbide crystal growth plane in said chamber for supporting the growth of silicon carbide crystalline material from a silicon carbide source material in a first crystallographic direction corresponding to said first growth plane;
 a second silicon carbide seed crystal having a second silicon carbide growth surface with a second silicon carbide crystal growth plane that is different from said first growth plane in said chamber for supporting the growth of silicon carbide crystalline material from a silicon carbide source material in a second crystallographic direction corresponding to said second growth plane; and
 a plurality of silicon carbide crystal growth dividers in said silicon carbide growth chamber, said dividers having opposing surfaces oriented substantially perpendicular to said first and second growth surfaces, wherein said dividers are spaced apart from one another to form a plurality of passages between said dividers of a size sufficient to accommodate the growth of silicon carbide crystals therebetween to form a plurality of silicon carbide crystals having different crystallographic orientations corresponding to said first and second growth planes.

23. The apparatus of claim 22, wherein at least one of said dividers comprises a first layer formed of a first material and a second layer formed of a second material that has different properties than said first material, said first and second layers forming opposing surfaces of said at least one divider.

24. The apparatus of claim 23, wherein said first layer comprises a material having a first coefficient of thermal expansion (CTE) substantially the same as the CTE of a silicon carbide crystal grown adjacent thereto from one of said first or second silicon carbide growth planes and said second layer comprises a material having a second CTE that is different from said first CTE and which is substantially the same as the CTE of a different silicon carbide crystal grown adjacent thereto from the other of said first or second silicon carbide growth planes.

* * * * *